United States Patent [19]
Smith

[11] Patent Number: 5,440,513
[45] Date of Patent: Aug. 8, 1995

[54] SRAM WITH PROGRAMMABLE PRESET DATA

[75] Inventor: Bradley P. Smith, Austin, Tex.

[73] Assignee: Motorola Inc., Schaumburg, Ill.

[21] Appl. No.: 55,451

[22] Filed: May 3, 1993

[51] Int. Cl.[6] ............................................. G11C 11/413
[52] U.S. Cl. ..................................... 365/190; 365/202; 365/203
[58] Field of Search ................... 365/189.01, 190, 202, 365/203, 154

[56] References Cited

U.S. PATENT DOCUMENTS

| | | | |
|---|---|---|---|
| 4,899,317 | 2/1990 | Hoekstra et al. | 365/190 X |
| 4,947,377 | 8/1990 | Hannai | 365/149 X |
| 4,995,004 | 2/1991 | Lee | 365/189.11 |
| 5,040,143 | 8/1991 | Matsumura et al. | 365/51 |
| 5,189,641 | 2/1993 | Arakawa | 365/190 X |
| 5,197,029 | 3/1993 | Schreck et al. | 365/189.01 |
| 5,233,561 | 8/1993 | Mori et al. | 365/189.01 X |
| 5,287,485 | 2/1994 | Umina et al. | 365/154 X |

*Primary Examiner*—Do Hyun Yoo
*Attorney, Agent, or Firm*—Daniel D. Hill

[57] ABSTRACT

A static random access memory (20) with programmable preset data includes two bit line pairs for each column of memory cells (31-36). In response to a control signal during a programming cycle, preset programming logic (28) charges one of the bit line pairs of each column of memory cells to a predetermined logic state and the other bit line pair to a logical complement of the predetermined logic state. Memory cells (31-36) of each column of memory cells are coupled to either one of the two bit line pairs by mask programming. During the programming cycle, each of the memory cells (31-36) store programmed data depending upon which bit line pair each memory cell is coupled to. The memory (20) provides the advantages of a static random access memory and the nonvolatility of a read only memory.

19 Claims, 4 Drawing Sheets

SRAM WITH PROGRAMMABLE PRESET DATA

FIELD OF THE INVENTION

This invention relates generally to memories, and more particularly to a static random access memory (SRAM) with programmable preset data.

BACKGROUND OF THE INVENTION

In general, semiconductor memories may be divided into two types, volatile memories and nonvolatile memories. As the name implies, volatile memories lose stored data when power is removed, whereas nonvolatile memories retain stored data when power is removed. Static random access memories (SRAMs) are one type of volatile memory. SRAMs are generally comprised of either four transistor or six transistor memory cells. Each SRAM cell is coupled to a bit line pair and to a word line. Data is read from or written into a selected SRAM cell via the bit line pair. SRAMs are generally used in applications that require high speed operation, such as a cache memory for a data processing system. An unlimited number of write operations can be performed on a SRAM cell without reducing reliability.

A read only memory (ROM) is a type of nonvolatile memory in which data is mask programmed by the semiconductor manufacturer. The mask programmed data of a ROM cannot be altered, and unlike a SRAM, the data is not lost when power is removed. ROM is used in various ways in the design of data processing systems. For example, ROM may be used to provide look-up tables needed in some mathematical functions, or for the display of characters. Also, ROM is used in the design of control units for computers to store the sequence of control variables needed for enabling the various operations in the computer. ROMs are used in applications where the programming is fixed, however, many systems require a nonvolatile memory in which the mask programmed data can be changed.

EPROMs (Erasable Programmable Read Only Memories) and EEPROMs (Electrically Erasable Programmable Read Only Memories) are types of nonvolatile memory that can be reprogrammed, however, unlike a SRAM, the number of times an EPROM or EEPROM can be reprogrammed is limited. In addition, ultraviolet (UV) light is needed to reprogram an EPROM, requiring special UV equipment. A high programming voltage, provided by the user or by a high voltage charge pump is required to reprogram an EEPROM. Also, the reprogramming time of an EPROM or EEPROM is generally much longer than the write cycle of a SRAM.

SUMMARY OF THE INVENTION

Accordingly, there is provided, in one form, an integrated circuit memory having a plurality of memory cells. The memory cells are organized as a matrix of rows and columns, where each column of memory cells has a first bit line and a second bit line. A programming circuit is coupled to the first bit line and to the second bit line, and charges the first bit line to a first predetermined logic state and charges the second bit line to a second predetermined logic state in response to receiving a first control signal. The memory cells of a column are coupled to either one of the first bit line and the second bit line. The memory cells store the first and second predetermined logic states in response to the first control signal. These and other features and advantages will be more clearly understood from the following detailed description taken in conjunction with the accompanying drawings.

DESCRIPTION OF A PREFERRED EMBODIMENT

Figure 1:
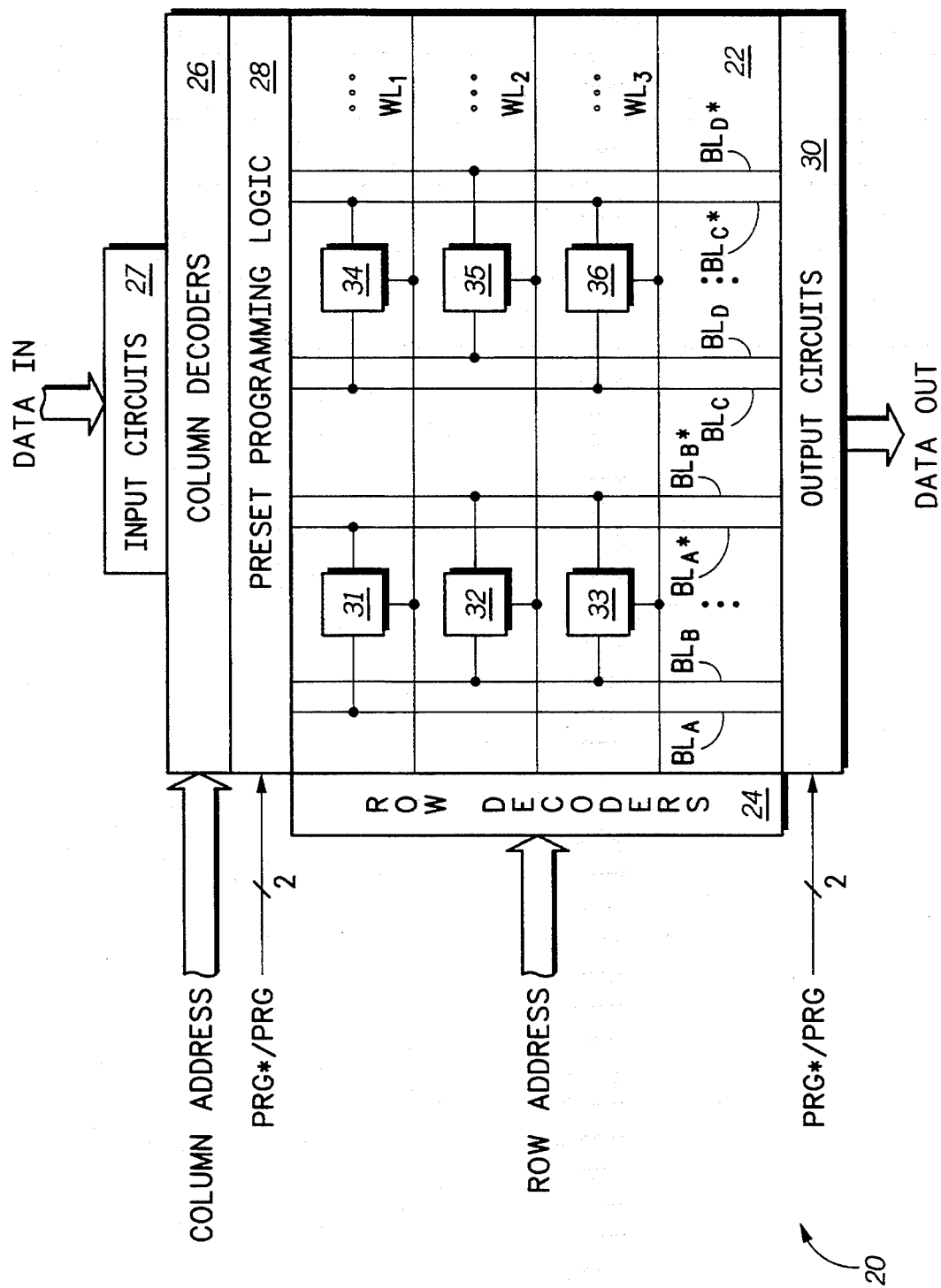
FIG. 1 illustrates in block diagram form an integrated circuit memory in accordance with the present invention.

FIG. 1 illustrates in block diagram form an integrated circuit memory 20 in accordance with the present invention. Memory 20 includes memory array 22, row decoders 24, column decoders 26, input circuits 27, preset programming logic 28, and output circuits 30. Memory array 22 includes memory cells arranged in a matrix of row and columns and connected to word lines and bit line pairs. The memory cells of memory array 22 are represented by memory cells 31–36 and are located at intersections of word lines and bit line pairs. Word lines labeled "WL$_1$", "WL$_2$", and "WL$_3$" are connected to row decoders 24 and run across array 22. Bit line pairs are connected to preset programming logic 28 and extend to output circuits 30. Memory cells 31, 32, and 33 and bit line pairs labeled "BL$_A$"/"BL$_A$*", and "BL$_B$"/"BL$_B$*" comprise a column of memory cells. (Note that an asterisk after a signal name indicates that the signal is a logical complement of a signal having the same name but lacking the asterisk.) Memory cells 34, 35, and 36 and bit line pairs labeled "BL$_C$"/"BL$_C$*", and "BL$_D$"/"BL$_D$*" also comprise a column of memory cells.

Column decoders 26 receives address signals labeled "COLUMN ADDRESS", and is coupled to memory array 22 through preset programming logic 28. Preset logic 28 receives two control signals labeled "PRG*/PRG", and is coupled to each bit line pair of memory array 22. Control signals PRG*/PRG are complementary control signals for activating a programming cycle of memory 20. Control signals PRG*/PRG can be provided by the user, or can be internally generated upon power-up of the system, or on some other predetermined occurrence. Row decoders 24 receives address signals labeled "ROW ADDRESS", and is coupled to each word line of memory 20. Input circuits 27 receive input data signals labeled "DATA IN" during a write cycle of memory 20, and are coupled to column decoders 26. Output circuits 30 are coupled to each bit line pair of memory array 22, receive control signals PRG*/PRG, and provide data signals labeled "DATA OUT" during a read cycle of memory 20. Input circuits 27 includes bit line loads, data input buffers write drivers and other circuits for inputting data. Output circuits 30 includes sense amplifiers, data output drivers and other circuits for outputting data.

Memory 20 has read and write cycles in addition to a programming cycle, and can function in a manner similar to a conventional SRAM. During a programming cycle of memory 20, in response to control signals PRG*/PRG being active, one pair of the two bit line pairs of a column are charged to a predetermined logic state and the other pair is charged to the logical complement of the predetermined logic state. A memory cell in a column may be connected to either one of the two bit line pairs, and is programmed to a predetermined logic state when the word line to which the memory cell is coupled is enabled. For example, if bit lines $BL_B$ and $BL_A^*$ are charged to a logic high and bit lines $BL_A$ and $BL_B^*$ are charged to a logic low, the memory cells connected to bit line pair $BL_A/BL_A^*$ store a logic low and the memory cells connected to bit line pair $BL_B/BL_B^*$ store a logic high. For the purpose of illustration, memory cell 31 is coupled to bit line pair $BL_A/BL_A^*$, and to word line $WL_1$. Memory cell 32 is coupled to bit line pair $BL_B/BL_B^*$, and to word line $WL_2$. Memory cell 34 is connected to bit line pair $BL_C/BL_C^*$, and to word line $WL_1$. Memory cell 35 is connected to bit line pair $BL_D/BL_D^*$, and to word line $WL_1$. Also, note that bit lines $BL_A$, $BL_B$, $BL_C$, and $BL_D$ are "true" bit lines, and bit lines $BL_A^*$, $BL_B^*$, $BL_C^*$, and $BL_D^*$ are "complement" bit lines. During a programming cycle, a predetermined number, or all of the word lines are enabled in order to program the memory cells to the preset data. In the preferred embodiment, memory 20 is mask programmed in a manner similar to programming a ROM. However, in other embodiments, other methods of programming are possible, such as with electrically programmable fuses, or with laser programmable fuses.

Each bit line pair serves as an input to the memory cells during the write cycle and a programming cycle of memory 20 and as an output during the read cycle. All of the memory cells connected to an enabled word line are able to provide their contents to their respective bit line pairs. Column decoders 26 select the bit line pairs for a write operation or a read operation. During a write cycle, input circuit 27 receives data signals DATA IN, and provides differential data signals to selected bit line pairs. During a read cycle, output circuit 30 receives differential data signals from selected bit line pairs and provides data signals DATA OUT.

During operation as a conventional SRAM, the two bit line pairs in each column of memory cells are connected together to function as a single bit line pair. Each memory cell can then be read from or written into like a conventional SRAM.

To read data from memory 20, row decoders 24 receives row address signals ROW ADDRESS to select a word line. Column address signals COLUMN ADDRESS are provided to column decoders 26. Column decoders 26 are coupled to each bit line pair through preset programming logic 28 and are coupled to output circuits 30. Note that the number of data signals and address signals provided to, or received from memory 20 have no special significance and may be different in other embodiments. Control signal PRG* is at a logic high voltage, or inactive, and control signal PRG is a logic low. Preset programming logic 28 couples memory array 22 to column decoders 26, and transmission gates 71 and 72 of output circuits 30 (illustrated in FIG. 4) couple the two bit line pairs of each column together.

Each memory cell of memory array 22 that is coupled to the selected word line provides its output as a differential voltage on a corresponding bit line pair. Output circuits 30 includes a sense amplifier 73 (illustrated in FIG. 4) which senses and amplifies the relatively small differential voltage provided to the bit line pair. Output circuits 30 provides a single-ended data signal DATA OUT corresponding to the differential voltage on the selected bit line pair.

During a write cycle of memory 20, the flow of data is essentially reversed. Data signals DATA IN are provided to input circuits 27. Column address signals COLUMN ADDRESS are provided to column decoders 26 to select a column. Row address signals ROW ADDRESS are provided to row decoders 24 to select a word line. As in a read cycle, control signal PRG* is inactive, or a logic high, and control signal PRG is a logic low causing column decoders 26 to be coupled to memory array 22 through preset programming logic 28. Transmissions gates 71 and 72 of output circuits 30 couple the two bit line pairs of each column together. Memory cells located on the enabled word line receive data from the selected bit line pairs. The voltage differential driven onto the bit line pairs by input circuits 27 overwrites a stored bit in the cross-coupled latch of each memory cell. At the end of a write cycle, the differential voltage on the bit line pair must be reduced to a level small enough to prevent data from being erroneously written into a memory cell during the following read cycle. Equalization of the bit line pairs is achieved by a bit line equalization circuit (not shown).

Integrated circuit memory 20 combines the advantages of a high speed SRAM with write and read cycles with the mask programmability and nonvolatility of ROMs. The memory cells of memory 20 can be mask programmed like a ROM to predetermined logic states. However, unlike a ROM, the information can be updated or modified from the mask programmed logic states as the need arises. Memory 20 may be used to "power-up" a data processing system with preset data like a ROM and then operate as a conventional SRAM, eliminating the need for having separate ROM and SRAM in the data processing system. Also, memory 20 may be used to develop and debug microcode for a ROM, allowing changes to the microcode to be easily implemented and tested, rather than making new masks to test each change. Memory 20 may also be used as onboard memory to provide test patterns to microprocessors and microcontrollers during power-up. In addition, registers can be programmed to power up with a unique number for mask set identification.

Figure 2:
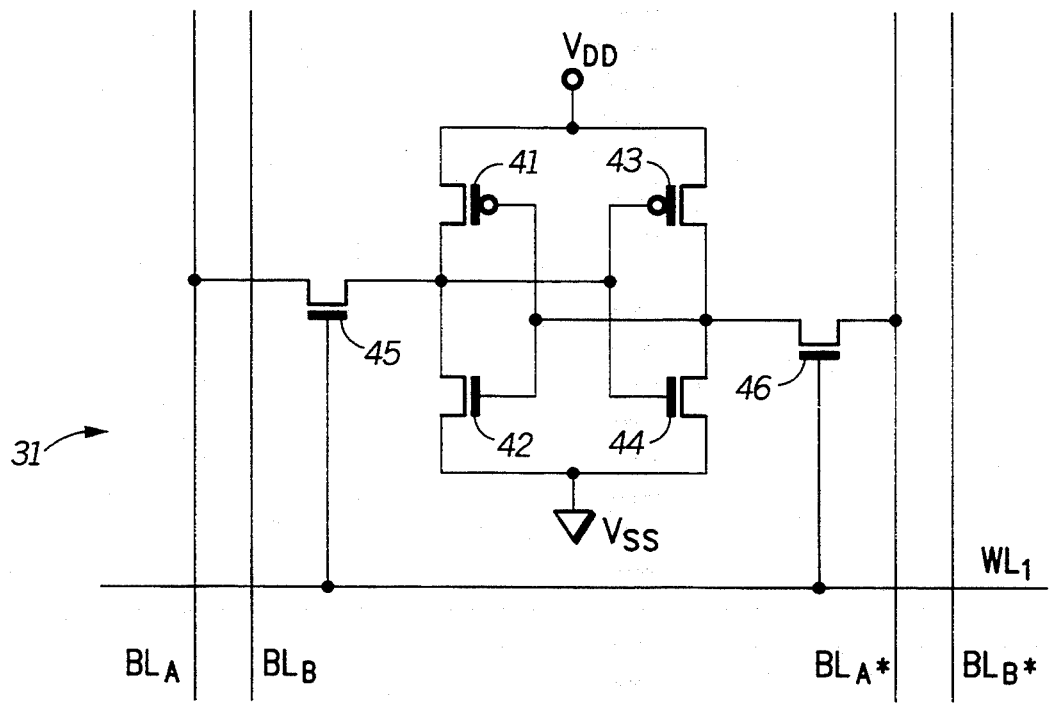
FIG. 2 illustrates in schematic diagram form a memory cell of the integrated circuit memory of FIG. 1 in accordance with one embodiment of the present invention.

FIG. 2 illustrates in schematic diagram form six transistor memory cell 31 of memory 20 of FIG. 1 in accordance with one embodiment of the present invention. Memory cell 31 includes N-channel transistors 42, 44, 45, and 46, and P-channel transistors 41 and 43. P-channel transistor 41 has a source connected to a positive power supply voltage terminal labeled "$V_{DD}$", a gate, and a drain. N-channel transistor 42 has a drain connected to the drain of P-channel transistor 41, a gate connected to the gate of P-channel 41, and a source connected to a negative power supply voltage terminal labeled "$V_{SS}$". P-channel transistor 43 has a source connected to $V_{DD}$, a gate connected to the drains of transistors 41 and 42, and a drain. N-channel transistor 44 has a drain connected to the drain of P-channel transistor 43, a gate connected to the gate of P-channel transistor 43, and a source connected to $V_{SS}$. The gates of transistors 41 and 42 are connected to the drains of transistors 43 and 44. N-channel transistor 45 has a first drain/source terminal connected to bit line $BL_A$, a second drain/source terminal connected to the drains of transistors 41 and 42, and a gate connected to word line $WL_1$. N-channel transistor 46 has a first drain/source terminal connected to bit line $BL_A^*$, a second drain/source terminal connected to the drains of transistors 43 and 44, and a gate connected to word line $WL_1$.

N-channel transistors 42 and 44 and P-channel transistors 41 and 43 form a cross-coupled latch for storing a data bit. P-channel transistors 41 and 43 provide active loads for memory cell 31. Memory cell 31 stores either a logic high voltage or a logic low voltage based on the logic state of the bit lines. N-channel transistors 45 and 46 couple the cross-coupled latch to a pair of bit lines when word line $WL_1$ is selected. To write data into memory cell 31, as during a normal write cycle or during a programming cycle, word line $WL_1$ is enabled as a logic high and complementary data signals are applied to bit lines $BL_A$ and $BL_A^*$ at a voltage great enough to overwrite the contents of the cross-coupled latch. Memory cell 31 will latch in either a logic high or a logic low state depending on the logic states of bit lines $BL_A$ and $BL_A^*$.

Assuming bit line $BL_A$ is a logic high and bit line $BL_A^*$ is a logic low when word line $WL_1$ is enable, N-channel pass transistors 45 and 46 are both conductive. The logic states of bit lines $BL_A$ and $BL_A^*$ are provided to the cross-coupled latch. A logic high is provided to the gates of transistors 43 and 44, causing P-channel transistor 43 to become substantially non-conductive and N-channel transistor 44 to become conductive. A logic low voltage equal to approximately the negative power supply voltage is provided to the gates of transistors 41 and 42. P-channel transistor 41 is conductive, and N-channel transistor 42 is substantially non-conductive. When word line $WL_1$ is deselected at the conclusion of the write cycle, the cross-coupled latch maintains the logic state that was written into it. Memory cell 31 maintains the logic state for as long as a power supply voltage is provided, or until rewritten.

During a read cycle of memory 20, word line $WL_1$ is enabled, biasing N-channel pass transistors 45 and 46 into conduction. Prior to enabling word line $WL_1$, the bit line pair is equalized and precharged to the voltage potential of $V_{DD}$. The latched logic state stored in the cross-coupled latch is provided to the bit line pair as a relatively low differential voltage, (approximately 50–100 millivolts). A sense amplifier (shown in FIG. 4), senses and amplifies the relatively low voltage. A read cycle does not affect the logic state of the stored data.

Figure 3:
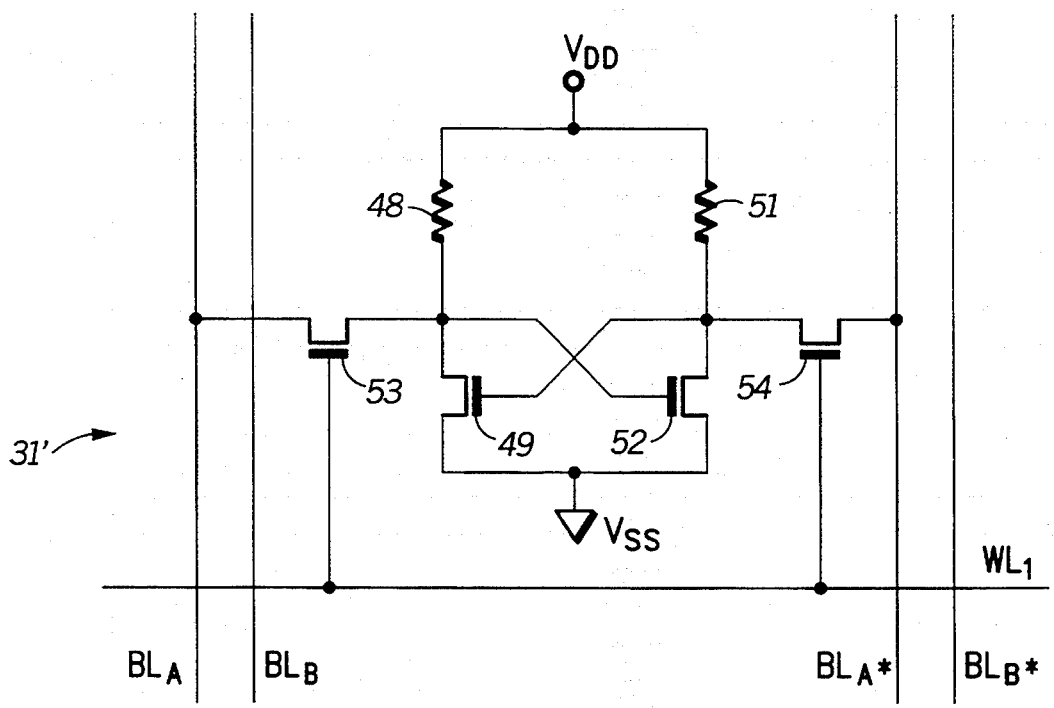
FIG. 3 illustrates in schematic diagram form a four transistor memory cell in accordance with another embodiment of the memory of FIG. 1.

FIG. 3 illustrates in schematic diagram form four transistor memory cell 31' in accordance with another embodiment of memory 20 of FIG. 1. Four transistor memory cell 31' includes resistors 48 and 51, and N-channel transistors 49, 52, 53, and 54. Resistor 48 has a first terminal connected to $V_{DD}$, and a second terminal. Resistor 51 has a first terminal connected to $V_{DD}$, and a second terminal. Resistors 48 and 51 are passive loads. N-channel transistor 49 has a drain connected to the second terminal of resistor 48, a gate connected to the second terminal of resistor 51, and a source connected to $V_{SS}$. N-channel transistor 52 has a drain connected to the second terminal of resistor 51, a gate connected to the second terminal of resistor 48, and a source connected to $V_{SS}$. N-channel transistor 53 has a first drain/source terminal connected to bit line $BL_A$, a second drain/source terminal connected to the second terminal of resistor 48, and a gate connected to word line $WL_1$. N-channel transistor 54 has a first drain/source terminal connected to bit line $BL_A^*$, a second drain/source terminal connected to the second terminal of resistor 51, and a gate connected to word line $WL_1$.

Four transistor memory cell 31' operates in the same manner as six transistor memory cell 31, except that four transistor memory cell 31' has resistors as passive load elements instead of having P-channel transistors.

Figure 4:
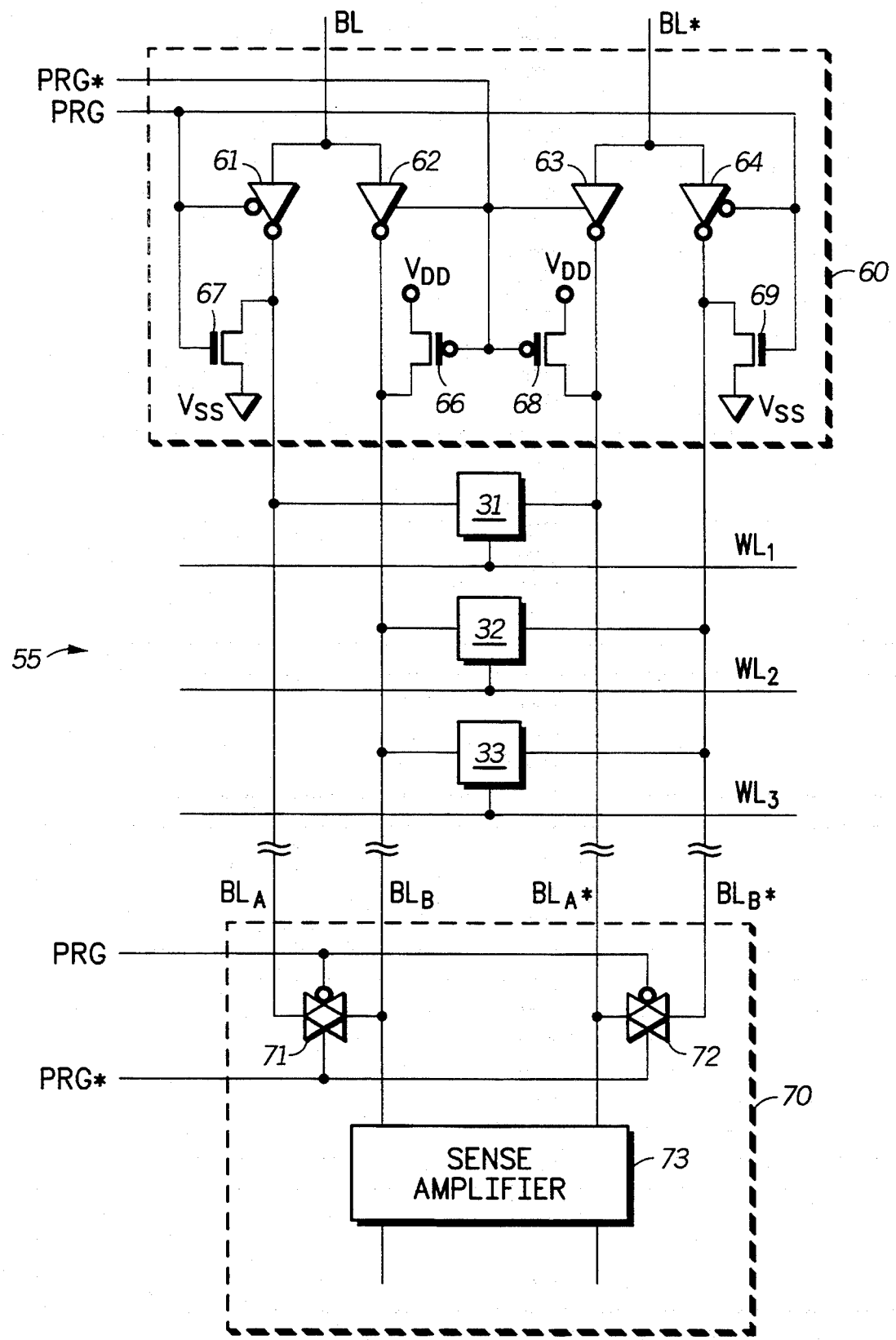
FIG. 4 illustrates in partial schematic diagram form and partial logic diagram form a portion of the integrated circuit memory of FIG. 1.

FIG. 4 illustrates in partial schematic diagram form and partial logic diagram form a memory portion 55 of integrated circuit memory 20 of FIG. 1. Memory portion 55 includes preset programming logic portion 60, memory cells 31, 32, and 33, bit line pairs $BL_A/BL_A^*$, and $BL_B/BL_B^*$, and output circuit portion 70. The two bit line pairs and memory cells 31, 32, and 33 comprise a representative column of memory array 22. Preset logic portion 60 is a portion of preset programming logic 28 of FIG. 1, and includes inverting driver circuits 61, 62, 63, and 64, N-channel transistors 67 and 69, and P-channel transistors 66 and 68. Driver circuit 61 has an input terminal connected to bit line BL, a control terminal for receiving control signal PRG and an output terminal connected to bit line $BL_A$. Driver circuit 62 has an input terminal connected to bit line BL, a control terminal for receiving a control signal labeled "PRG" and an output terminal connected to bit line $BL_B$. Driver circuit 63 has an input terminal connected to bit line BL*, a control terminal for receiving control signal PRG* and an output terminal connected to bit line $BL_A$. Driver circuit 64 has an input terminal connected to bit line BL*, a control terminal for receiving control signal PRG and an output terminal connected to bit line $BL_B^*$. P-channel transistor 66 has a source connected to $V_{DD}$, a gate connected to the control terminal of driver circuit 62 for receiving control signal PRG*, and a drain connected to the output terminal of driver circuit 62. N-channel transistor 67 has a drain connected to the output terminal of driver circuit 61, a gate connected to the control terminal of driver circuit 61 for receiving control signal PRG, and a source connected to $V_{SS}$. P-channel transistor 68 has a source connected to $V_{DD}$, a gate connected to the control terminal of driver circuit 63 for receiving control signal PRG*, and a drain connected to the output terminal of driver circuit 63. N-channel transistor 69 has a source connected to the output terminal of driver circuit 64, a gate connected to the control terminal of driver circuit 64 for receiving control signal PRG, and a drain connected to $V_{SS}$. Bit line pair BL/BL* couple preset logic portion 60 to column decoders 26 (FIG. 1). Column decoders 26 may therefore be conventional column decoders that couple to only one bit line pair for each column of memory cells.

Output portion 70 is a portion of output circuits 30 of FIG. 1 and includes transmission gates 71 and 72, and sense amplifier 73. Transmission gate 71 has a first terminal connected to bit line $BL_A$, a second terminal connected to bit line $BL_B$, and control terminals for receiving control signals PRG and PRG*. Transmission gate 72 has a first terminal connected to bit line $BL_A^*$, a second terminal connected to bit line $BL_B^*$, and control terminals for receiving control signals PRG and PRG*. Sense amplifier 73 has a first input terminal connected to the second terminal of transmission gate 71, a second input terminal connected to the first terminal of transmission gate 72, and first and second output terminals.

During a write cycle or a read cycle of memory 20, complementary control signals PRG*/PRG are inactive, that is, control signal PRG* is a logic high and control signal PRG is a logic low. A write enable signal (not shown) is asserted to determine whether a write cycle or a read cycle is to be performed. A logic high control signal PRG* causes P-channel transistors 66 and 68 to be substantially non-conductive, and enables driver circuits 62 and 63. A logic low control signal PRG causes N-channel transistors 67 and 69 to be substantially non-conductive and enables driver circuits 61 and 64. Also, transmission gates 71 and 72 are conductive, which causes "true" bit lines $BL_A$ and $BL_B$ to be electrically shorted together to function as a single bit line, and causes "complement" bit lines $BL_A^*$ and $BL_B^*$ to be electrically shorted together to function as a single bit line. This allows memory 20 to be used as a conventional SRAM with conventional write and read cycles as described above in connection with FIG. 1. Transmission gates 71 and 72 are shown coupled to the end of the bit line pairs in output portion 70 of FIG. 4, however in other embodiments, transmission gates 71 and 72 may be located anywhere along the bit line pairs, including in preset logic portion 60. Control signal PRG*/PRG can be made active when necessary to reset, or reprogram, the memory cells of memory array 22 to their mask programmed logic states.

During a programming cycle, control signals PRG*/PRG are active, that is, control signal PRG* is a logic low and control signal PRG is a logic high. A logic low control signal PRG* disables driver circuits 62 and 63, and causes P-channel transistors 66 and 68 to be conductive. A logic high control signal PRG disables driver circuits 61 and 64, and causes N-channel transistors 67 and 69 to be conductive. Transmission gates 71 and 72 are substantially non-conductive. When N-channel transistors 67 and 69 are conductive, the voltage of bit lines $BL_A$ and $BL_B^*$, respectively, are reduced to substantially $V_{SS}$. When P-channel transistors 66 and 68 are conductive, the voltage of bit lines $BL_B$ and $BL_A^*$, respectively are increased to substantially $V_{DD}$. Therefore, bit line pair $BL_A/BL_A^*$ writes a logic low to any memory cell that it is connected to, such as memory cell 31. Likewise, bit line pair $BL_B/BL_B^*$ writes a logic high to any memory cell that it is connected to, such as memory cells, 32 and 33. The logic states of the memory cells are maintained until either the power supply voltage is removed, or until overwritten during a write cycle. Inverting driver circuits 61, 62, 63, and 64 output a high impedance when disabled and therefore effectively decouple column decoders 26 (FIG. 1) from the bit line pairs. Note that transmission gates may be substituted for inverting driver circuits 61, 62, 63, and 64 in some embodiments.

Figure 5:
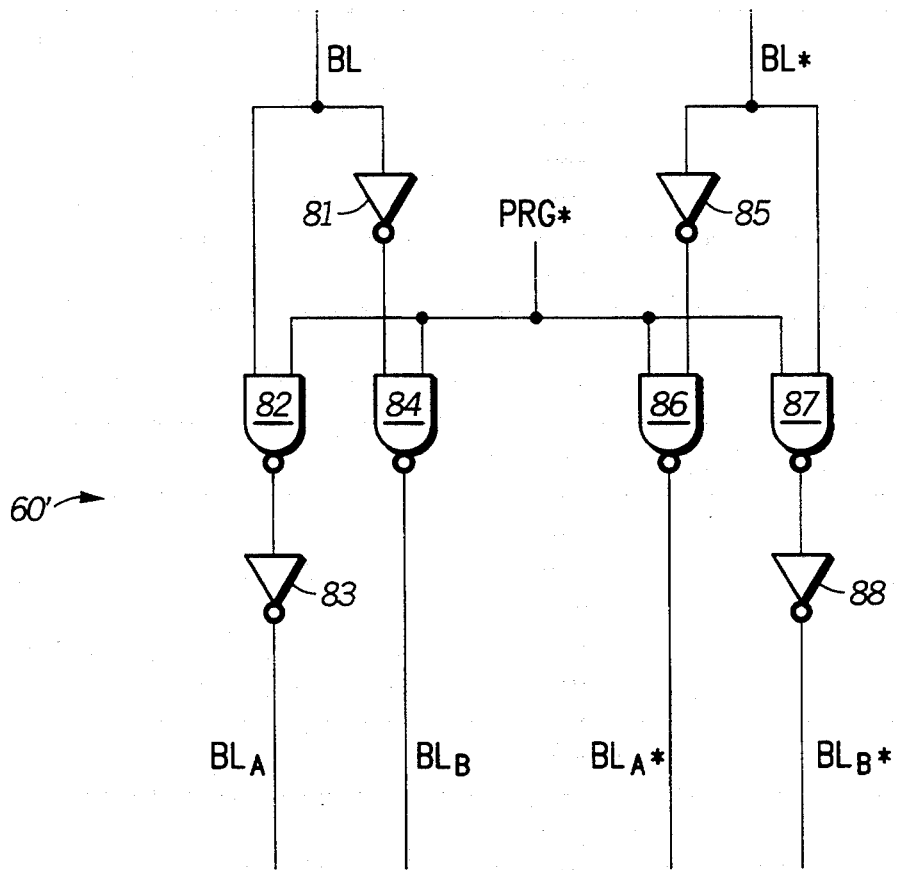
FIG. 5 illustrates in logic diagram form another embodiment of the preset programming logic circuit portion illustrated in FIG. 4.

FIG. 5 illustrates in logic diagram form a preset programming logic circuit portion 60' as a second embodiment of preset programming logic circuit portion 60 of FIG. 4. Preset logic circuit portion 60' includes inverters 81, 83, 85, and 88, and NAND logic gates 82, 84, 86, and 87. Inverter 81 has an input terminal connected to bit line BL, and an output terminal. NAND logic gate 82 has a first input terminal connected to bit line BL, a second input terminal for receiving control signal PRG*, and an output terminal. Inverter 83 has an input terminal connected to the output terminal of NAND logic gate 82, and an output terminal connected to bit line $BL_A$. NAND logic gate 84 has a first input terminal connected to the output terminal of inverter 81, a second input terminal connected to the second input terminal of NAND logic gate 82 for receiving control signal PRG*, and an output terminal connected to bit line $BL_B$. Inverter 85 has an input terminal connected to bit line BL*, and an output terminal. NAND logic gate 86 has a first input terminal connected to the second input terminals of NAND logic gates 82 and 84 for receiving control signal PRG*, a second input terminal connected to the output terminal of inverter 85. NAND logic gate 87 has a first input terminal for receiving control signal PRG*, and second input terminal connected to bit line BL*, and an output terminal. Inverter 88 has an input terminal connected to the output terminal of NAND logic gate 87, and an output terminal connected to bit line $BL_B^*$.

Preset logic circuit portion 60' performs substantially the same function as preset programming logic circuit portion 60. A programming cycle is initiated by providing control signal PRG* as a logic low to an input terminal of each NAND logic gate. The output terminal of each NAND logic gate provides a logic high voltage regardless of the logic state of the other input terminals of the NAND logic gates. Inverters 83 and 88 invert the logic low output signals of NAND logic gates 82 and 87. Therefore, during a programming cycle, the bit lines are charged to predetermined logic states. Bit line $BL_A$ is charged to a logic low voltage, bit line $BL_A^*$ is charged to a logic low voltage, bit line $BL_B$ is charged to a logic high voltage, and bit line $BL_B^*$ is charge to a logic low voltage. During a write cycle or a read cycle of memory 20, control signal PRG* is a logic high. When control signal PRG* is a logic high, the logic states at the output terminals of NAND logic gates 82, 84, 86, and 87 are determined by the logic states of bit lines BL and BL*. For example, if bit line BL is a logic high, both of bit lines $BL_A$ and $BL_B$ are at a logic high. If bit line BL* is a logic low, both of bit lines $BL_A^*$ and $BL_B^*$ are at a logic low.

Preset logic circuit portion 60' provides the advantage of requiring only single-ended control signal PRG* instead of complementary control signals as required for preset logic circuit portion 60 of FIG. 4. Note that NAND logic gates 82, 84, 86, and 87 represent logic operations rather than single logic gates.

While the invention has been described in the context of a preferred embodiment, it will be apparent to those skilled in the art that the present invention may be modified in numerous ways and may assume many embodiments other than that specifically set out and described above. For example, in another embodiment, a dynamic random access memory (DRAM) may be used instead of a SRAM. Accordingly, it is intended by the appended claims to cover all modifications of the invention which fall within the true spirit and scope of the invention.

What is claimed is:

1. An integrated circuit memory, comprising:
    a plurality of memory cells organized as rows and columns, each column of said plurality of memory cells comprising a first bit line pair and a second bit line pair;
    decoding means for selecting a memory cell in response to receiving an address signal; and
    programming means, coupled to said first bit line pair and to said second bit line pair, for charging said first bit line pair to a first predetermined logic state and charging said second bit line pair to a second predetermined logic state in response to receiving a first control signal;

wherein the programming means comprises:

driving means for coupling said first and second bit line pairs of a column to said decoding means in response to a second control signal; and charging means, coupled to said first and second bit line pairs of said column, for charging said first bit line pair to the first predetermined logic state and charging said second bit line pair to the second predetermined logic state in response to receiving said first control signal;

wherein a memory cell of said column is selectively coupled to either of said first bit line pair or said second bit line pair, for storing either of said first or second predetermined logic states, respectively, in response to said first control signal.

2. The integrated circuit memory of claim 1, wherein each of said plurality of memory cells is characterized as being a six transistor static random access memory cell.

3. The integrated circuit memory of claim 1, wherein each of said plurality of memory cells is characterized as being a four transistor static random access memory cell.

4. The integrated circuit memory of claim 1, wherein said programming means comprises logic means for coupling said first and second bit line pairs to said decoding means in response to the second control signal, and in response to said first control signal, decoupling said first and second bit line pairs from said decoding means and charging said first bit line pair to said first predetermined logic state and charging said second bit line pair to said second predetermined logic state.

5. An integrated circuit memory, comprising:

a plurality of word lines;

a plurality of first bit line pairs intersecting said plurality of word lines;

a plurality of second bit line pairs intersecting said plurality of word lines;

a plurality of memory cells located at intersections of said plurality of word lines and said pluralities of first and second bit line pairs, each memory cell is coupled to a word line and to a bit line pair of either of said plurality of first bit line pairs or said plurality of second bit line pairs;

decoding means for selecting a memory cell in response to receiving an address signal; and programming means, coupled to said plurality of first and second bit line pairs, and to said decoding means, for receiving a control signal, and in response to said control signal being in a first logic state, said programming means decoupling said pluralities of first and second bit line pairs from said decoding means and causing said plurality of first bit line pairs to be charged to a predetermined logic state, and causing said plurality of second bit line pairs to be charged to a logical complement of said predetermined logic state.

6. The integrated circuit memory of claim 5, wherein said plurality of memory cells includes six transistor static random access memory cells.

7. The integrated circuit memory of claim 5, wherein said plurality of memory cells includes four transistor static random access memory cells.

8. The integrated circuit memory of claim 5, wherein said programming means comprises:

driving means for coupling said pluralities of first and second bit line pairs to said decoding means in response to said control signal being in a second logic state; and charging means, coupled to said pluralities of first and second bit line pairs, for charging said plurality of first bit line pairs to said predetermined logic state and charging said plurality of second bit line pairs to said logical complement of said predetermined logic state in response to receiving said control signal in said first logic state.

9. The integrated circuit memory of claim 5, wherein said programming means comprises logic means having a plurality of first input terminals coupled to said decoding means, a plurality of second input terminals for receiving said control signal, and a plurality of output terminals coupled to said pluralities of first and second bit line pairs, said logic means for coupling said decoding means to said pluralities of first and second bit line pairs in response to said control signal being in a second logic state and for decoupling said decoding means from said pluralities of first and second bit line pairs and charging said plurality of first bit line pairs to said predetermined logic state, and charging said plurality of second bit line pairs to the logical complement of said predetermined logic state in response to said control signal being in said first logic state.

10. The integrated circuit memory of claim 9, wherein said plurality of first bit line pairs comprises a plurality of first true and first complement bit lines, and said plurality of second bit line pairs comprises a plurality of second true and second complement bit lines.

11. The integrated circuit memory of claim 10, further comprising:

first gating means for coupling one of said plurality of first true bit lines and a corresponding one of said plurality of second true bit lines in response to said control signal being in said second logic state; and second gating means for coupling one of said plurality of first complement bit lines and a corresponding one of said plurality of second complement bit lines in response to said control signal being in said second logic state.

12. The integrated circuit memory of claim 9, wherein said logic means comprises logic circuits for performing a logic NAND operation.

13. A static random access memory with programmable preset data having a write cycle, a read cycle, and a programming cycle, comprising:

a plurality of word lines;

a plurality of first bit line pairs intersecting said plurality of word lines, each first bit line pair providing complementary signals of a first predetermined logic state;

a plurality of second bit line pairs intersecting said plurality of word lines, each second bit line pair providing complementary signals of a second predetermined logic state; and a plurality of memory cells arranged at intersections of said plurality of word lines and said first and second pluralities of bit line pairs, each memory cell is coupled to a word line and to a bit line pair of either of said plurality of first bit line pairs or said plurality of second bit line pairs;

decoding means for receiving an address signal, and in response, selecting a memory cell, said memory cell receiving data during said write cycle and providing data during said read cycle;

programming means, coupled to said plurality of first bit line pairs and to said plurality of second bit line pairs, for receiving a control signal, and in response to said control signal being inactive, coupling said plurality of first and second bit line pairs to said decoding means, and in response to said control signal being active indicating said programming cycle, said programming means charging said plurality of first bit line pairs to said first predetermined logic state, and charging said plurality of second bit line pairs to said second predetermined logic state;

wherein each memory cell coupled to a bit line pair of said first plurality of bit line pairs stores said first predetermined logic state, and each memory cell coupled to a bit line pair of said second plurality of bit line pairs stores said second predetermined logic state during said programming cycle.

14. The static random access memory of claim 13, wherein said plurality of memory cells includes six transistor static random access memory cells.

15. The static random access memory of claim 13, wherein said plurality of memory cells includes four transistor static random access memory cells.

16. The static random access memory of claim 13, wherein said programming means comprises:

driving means for coupling said pluralities of first and second bit line pairs to said decoding means in response to said control signal being inactive; and charging means, coupled to said pluralities of first and second bit line pairs, for charging said plurality of first bit line pairs to said first predetermined logic state and charging said plurality of second bit line pairs to said second predetermined logic state in response to said control signal being active.

17. The static random access memory of claim 13, wherein said programming means comprises logic means having a plurality of first input terminals coupled to said decoding means, a plurality of second input terminals for receiving said control signal, and a plurality of output terminals coupled to said pluralities of first and second bit line pairs, said logic means for coupling said decoding means to said pluralities of first and second bit line pairs in response to said control signal being inactive, and for decoupling said decoding means from said pluralities of first and second bit line pairs and charging said plurality of first bit line pairs to said first predetermined logic state, and charging said plurality of second bit line pairs to a logical complement of said first predetermined logic state in response to said control signal being active.

18. The static random access memory of claim 13, wherein said plurality of first bit line pairs comprises a plurality of first true and first complement bit lines, and said plurality of second bit line pairs comprises a plurality of second true and second complement bit lines.

19. The static random access memory of claim 18, further comprising:

first gating means for coupling one of said plurality of first true bit lines and a corresponding one of said plurality of second true bit lines in response to said control signal being inactive; and second gating means for coupling one of said plurality of first complement bit lines and a corresponding one of said plurality of second complement bit lines in response to said control signal being inactive.

* * * * *